(12) United States Patent
Fiscus

(10) Patent No.: US 6,628,154 B2
(45) Date of Patent: Sep. 30, 2003

(54) DIGITALLY CONTROLLED ANALOG DELAY LOCKED LOOP (DLL)

(75) Inventor: Timothy E. Fiscus, South Burlington, VT (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/918,583

(22) Filed: Jul. 31, 2001

(65) Prior Publication Data

US 2003/0025539 A1 Feb. 6, 2003

(51) Int. Cl.$^7$ ................................................ H03L 7/06
(52) U.S. Cl. ...................................... 327/158; 327/277
(58) Field of Search ................................ 327/158, 149, 327/150, 153, 157, 159, 161, 270, 271, 277, 278, 284, 287, 280

(56) References Cited

U.S. PATENT DOCUMENTS

| 4,330,750 A | | 5/1982 | Mayor | 328/55 |
|---|---|---|---|---|
| 5,146,121 A | * | 9/1992 | Searles et al. | 327/276 |
| 5,382,921 A | * | 1/1995 | Estrada et al. | 327/159 |
| 5,416,436 A | | 5/1995 | Rainard | 327/270 |
| 5,744,991 A | * | 4/1998 | Jefferson et al. | 327/12 |
| 5,994,934 A | | 11/1999 | Yoshimura et al. | 327/158 |
| 6,046,620 A | * | 4/2000 | Relph | 375/374 |
| 6,100,733 A | | 8/2000 | Dortu et al. | 327/149 |
| 6,101,197 A | * | 8/2000 | Keeth et al. | 370/503 |
| 6,144,713 A | | 11/2000 | Eto | 375/375 |
| 6,157,691 A | | 12/2000 | Wei | 375/376 |
| 6,222,894 B1 | | 4/2001 | Lee | 375/376 |
| 6,242,955 B1 | * | 6/2001 | Shen et al. | 327/158 |
| 6,297,680 B1 | * | 10/2001 | Kondo | 327/276 |
| 6,327,318 B1 | * | 12/2001 | Bhullar et al. | 375/374 |
| 6,333,959 B1 | * | 12/2001 | Lai et al. | 377/69 |

FOREIGN PATENT DOCUMENTS

| EP | 0306662 | 3/1989 |
|---|---|---|
| EP | 0949760 | 10/1999 |
| JP | 8170982 | 1/1996 |
| JP | 9088227 | 7/1999 |

* cited by examiner

Primary Examiner—Timothy P. Callahan
Assistant Examiner—Cassandra Cox
(74) Attorney, Agent, or Firm—Christopher P. Maiorana, P.C.

(57) ABSTRACT

An apparatus comprising an analog delay line and a control circuit. The analog delay line may be configured to generate an output signal in response to an input signal, a first control signal, and a second control signal. A phase of the output signal may be (i) coarsely adjustable with respect to the input signal in response to the first control signal and (ii) finely and continuously adjustable in response to the second control signal. The control circuit may be configured to generate the first and the second control signals in response to the input signal and the output signal.

16 Claims, 9 Drawing Sheets

DIGITALLY CONTROLLED ANALOG DELAY LOCKED LOOP (DLL)

FIELD OF THE INVENTION

The present invention relates to a method and/or architecture for Delay Locked Loops (DLLs) generally and, more particularly, to a method and/or architecture for a digitally controlled analog Delay Locked Loop (DLL).

BACKGROUND OF THE INVENTION

Some applications can require that data be valid less than 0.35 ns (250 MHz) from a rising clock edge. The clock to data valid (tco) time and the data output hold time (tdoh) dictate the data valid window. Also, the duty cycle of the data can be required to follow the duty cycle of the clock so that the data valid window is not reduced. A zero delay buffer that tracks the clock jitter and duty cycle can be used to meet the requirements.

A conventional zero delay buffer that tracks the clock jitter and duty cycle can include a Delay Locked Loop (DLL). The DLL can generate a phase-adjusted version of an input clock such that a desired edge (e.g., rising or falling) of the DLL clock occurs a time tco before a corresponding edge of the input clock. The phase-adjusted clock can be used to clock data out of a chip so that the data to input clock time is ideally zero.

The DLL is a closed loop system that adjusts the propagation through a delay line such that the delay is equal to the clock period minus the clock to output delay. A phase detector and filter adjust the delay line until a feedback clock is delayed 360 degrees (i.e., phase aligned) with respect to the input clock. Since the compensation delay can be set equal to the time tco, the delay line can have a delay equal to the clock period minus the time tco.

Every cycle the DLL makes an adjustment with the phase detector and filter that corresponds to a phase adjustment in the delay line. The adjustment determines the resolution of the DLL. A fine adjustment corresponds to a small phase adjustment (high resolution) and a coarse adjustment corresponds to a large phase adjustment (low resolution). The DLL needs to have a fast lock time and a fine resolution for low jitter. A fast lock time requires a coarse adjustment in the delay line and a fine resolution requires a fine adjustment in the delay line.

Conventional DLLs either use a digital delay line or an analog delay line. A digital delay line can provide fast lock time at the cost of resolution. An analog delay line can provide good resolution but can require lock acquisition aids such as changing charge pump currents that can cause problems.

Referring to FIG. 1, a block diagram of a circuit 10 is shown illustrating an analog DLL. The circuit 10 includes a phase detector 12, an analog delay line 14, a compensation delay circuit 16, a charge pump 18 and an analog loop filter 20. The phase detector 12 is implemented without a dead zone. The analog delay line 14 can provide minimal jitter. The circuit 10 integrates phase error onto a capacitor in the filter 20. Since the phase error is integrated onto a capacitor and the phase detector does not have a dead zone, the circuit 10 can provide low clock jitter or fine resolution.

To reduce jitter of the signal DLL_CLOCK, the bandwidth of the DLL 10 can be reduced. The bandwidth is reduced when the capacitance of the loop filter 20 is made large and/or the current from the charge pump 18 is made small. With reduced bandwidth, every up/down cycle of the phase detector only adjusts the phase of the signal DLL_CLOCK by a small amount or not at all when the reference clock REF_CLOCK and the feedback signal FBK have zero degrees of phase error. For coarse adjustment, the bandwidth of the DLL can be made wider by decreasing the capacitor size and/or increasing the charge pump current. For large bandwidths, every up/down cycle of the phase detector adjusts the phase of the signal DLL_CLOCK by a greater amount than for the fine adjustment (small bandwidths).

The analog DLL 10 can provide good resolution. However, using lock acquisition aids that change the charge pump currents or the loop filter can make designing for stability complicated. Also, the analog DLL 10 is limited as to how fast lock can be obtained. In addition, different locking methods can be difficult to implement; such as a binary search.

Referring to FIG. 2, a block diagram of a circuit 30 is shown illustrating a digital DLL. The circuit 30 includes a phase detector 32, a coarse digital delay line 34, a fine digital delay line 36, a compensation delay 28 and a digital loop filter 40. The digital DLL 30 can yield a smaller (size), faster locking, and easier migrating DLL. The digital DLL 30 uses the coarse delay line 34 to get close to lock and the fine delay line 36 to obtain and maintain lock. The charge pump and filter (i.e., elements 18 and 20 of FIG. 1) are replaced by the digital loop filter 40. The digital loop filter 40 includes an up/down counter that only increments/decrements every M up/down cycles, where M is determined by the filter size.

The digital DLL 30 can be less complicated and has a faster lock time than the analog DLL 10. The digital DLL 30 can be easier to migrate to other technologies. The digital DLL 30 can be smaller than the analog DLL 10 because there is no large loop filter. However, since the fine delay line is a digital element, the resolution is limited to some amount. Also, since the phase error is not integrated, the output can have a dead zone where the digital DLL 30 does not respond until a phase error reaches a particular magnitude. When the particular magnitude of phase error occurs, the DLL 30 is adjusted by the fine adjust.

SUMMARY OF THE INVENTION

The present invention concerns an apparatus comprising an analog delay line and a control circuit. The analog delay line may be configured to generate an output signal in response to an input signal, a first control signal, and a second control signal. A phase of the output signal may be (i) coarsely adjustable with respect to the input signal in response to the first control signal and (ii) finely and continuously adjustable in response to the second control signal. The control circuit may be configured to generate the first and the second control signals in response to the input signal and the output signal.

The objects, features and advantages of the present invention include providing a digitally controlled analog delay locked loop that may (i) provide fine resolution, (ii) have fast lock acquisition, (iii) provide a wide locking range, (iv) eliminate need for fuses or metal optioning for different speed sorts, (v) provide lower speed sorts that have the same resolution as higher speed sorts, and/or (vi) be used in applications that need a zero delay buffer including memory chips that need a small clock to output delay.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
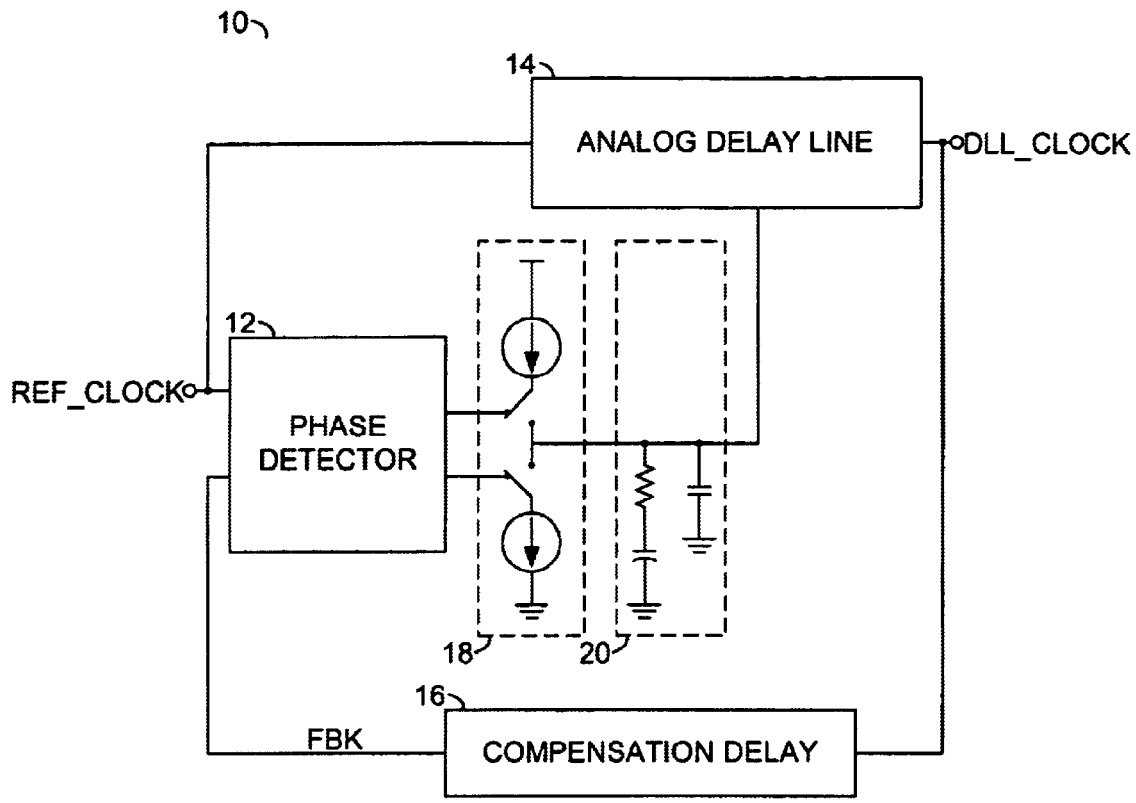
FIG. 1 is a block diagram of an analog delay lock loop circuit.
Figure 2:
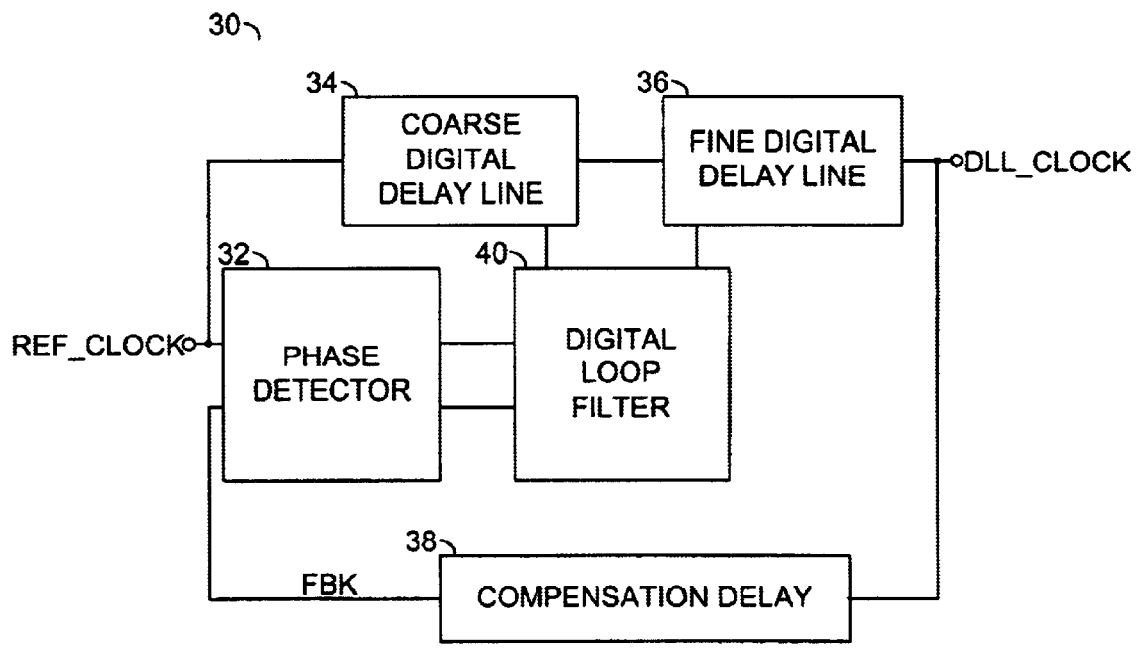
FIG. 2 is a block diagram of a digital delay lock loop circuit.
Figure 3:
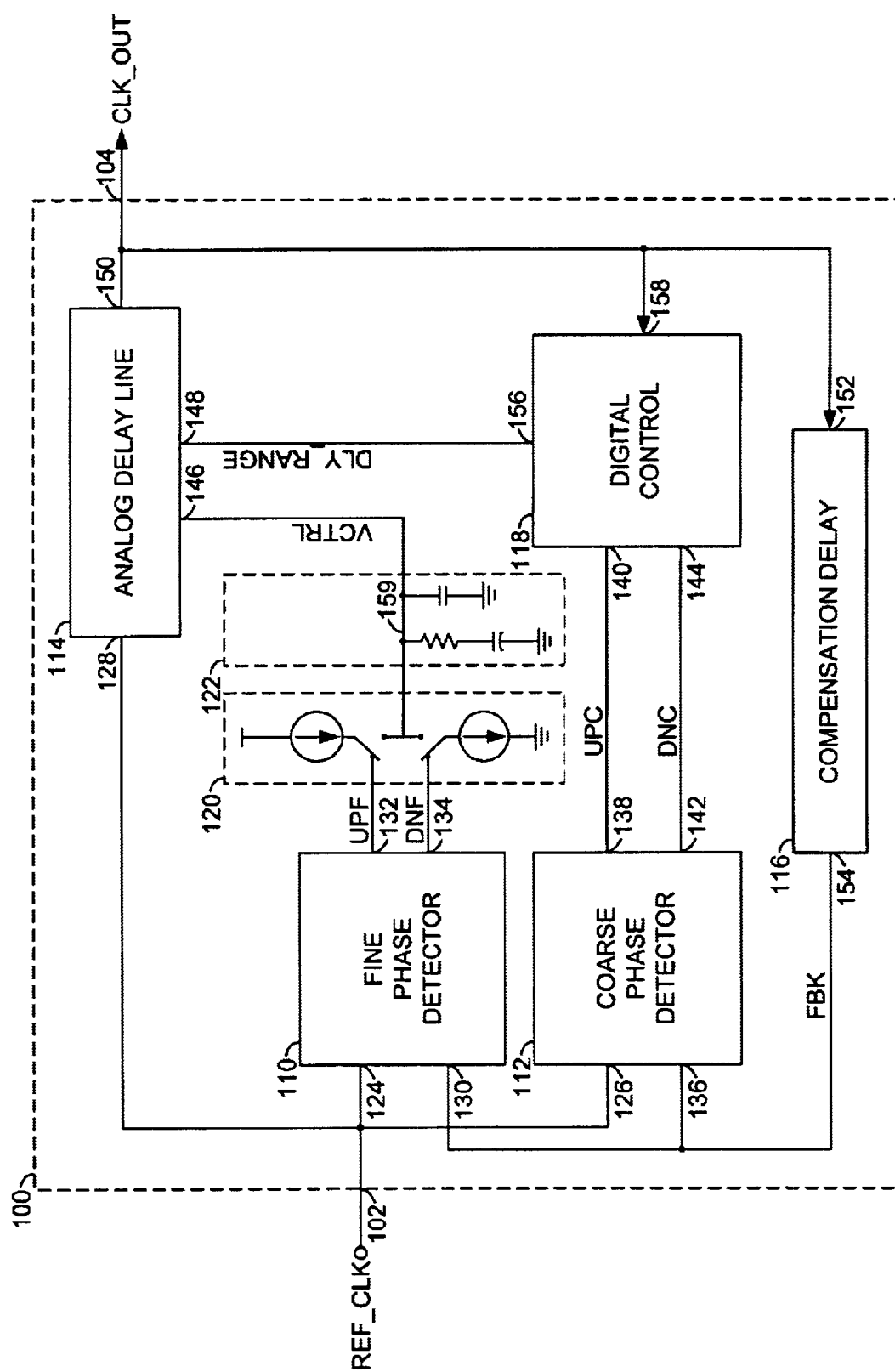
FIG. 3 is a top level diagram of a preferred embodiment of the present invention.

Referring to FIG. 3, a top level diagram of a circuit 100 is shown in accordance with a preferred embodiment of the present invention. The circuit 100 may be implemented as a digitally controlled analog delay locked loop (DLL). The circuit 100 may have an input 102 that may receive a reference clock (e.g., REF_CLK) and an output 104 that may present a signal (e.g., CLK_OUT). The circuit 100 may be configured to generate the signal CLK_OUT having an edge (e.g., rising or falling) that precedes a corresponding edge of the signal REF_CLK by a predetermined period of time (e.g., tco). The signal CLK_OUT may track the jitter and duty cycle of the signal REF_CLK.

The circuit 100 may comprise a circuit 110, a circuit 112, a circuit 114, a circuit 116, a circuit 118, a circuit 120 and a circuit 122. The circuit 110 may be implemented as a fine (resolution) phase detector circuit. The circuit 112 may be implemented as a coarse (resolution) phase detector circuit. The circuit 114 may be implemented as an analog delay line. The circuit 114 may be configured to provide a delay that may be both coarsely and finely adjusted. The circuit 116 may be implemented as a compensation delay circuit. In one example, the circuit 116 may be implemented to compensate for a clock to output delay time (tco) of a memory circuit. The circuit 118 may be implemented as a control circuit. In one example, the circuit 118 may be implemented using digital logic. The circuit 120 may be implemented as a charge pump circuit. The circuit 122 may be implemented as an analog filter circuit.

The signal REF_CLK may be presented to an input 124 of the circuit 110, an input 126 of the circuit 112 and an input 128 of the circuit 114. The circuit 110 may have an input 130 that may receive a signal (e.g., FBK), an output 132 that may present a control signal (e.g., UPF) that may be presented to a first input of the circuit 120, and an output 134 that may present a second control signal (e.g., DNF) that may be presented to a second input of the circuit 120. The signal FBK may be a feedback signal generated in response to the signal CLK_OUT. The signals UPF and DNF may be charge pump control signals (e.g., pump-up and pump-down, respectively). In one example, the signals UPF and DNF may be used to make fine phase adjustments in the signal CLK_OUT.

The signal FBK may be presented to an input 136 of the circuit 112. The circuit 112 may be configured to generate a number of control signals that may be used to control the circuit 118. In one example, the circuit 112 may have an output 138 that may present a control signal (e.g., UPC) to an input 140 of the circuit 118 and an output 142 that may present a control signal (e.g., DNC) to an input 144 of the circuit 118. The signals UPC and DNC may be used to make coarse phase adjustments. For example, the signal UPC may be used to increase a range of delay provided by the circuit 100. The signal DNC may be used to decrease the range of delay provided by the circuit 100. Further description of the signals UPC and DNC may be found below in connection with FIG. 13. Alternatively, other types and numbers of control signals may be generated by the circuit 112 to meet the design criteria of a particular implementation.

The circuit 114 may have an input 146 that may receive a signal (e.g., VCTRL), an input 148 that may receive a signal. (e.g., DLY_RANGE), and an output 150 that may present the signal CLK_OUT. The signal VCTRL may be an analog control signal. The signal DLY_RANGE may be a digital control signal. The circuit 114 may be configured to select a range of delays in response to the signal DLY_RANGE. The circuit 114 may be further configured to generate a delay that may be finely and continuously varied within the particular range selected in response to the signal VCTRL. The circuit 114 may be configured to generate the signal CLK_OUT as a phase-adjusted version of the signal REF_CLK, where the phase adjustment is determined in response to the signals VCTRL and DLY_RANGE.

The circuit 116 may have an input 152 that may receive the signal CLK_OUT and an output 154 that may present the signal FBK. The circuit 116 may be configured to generate the signal FBK in response to the signal CLK_OUT. In one example, the circuit 116 may be configured to compensate for a clock to output delay (tco) of a memory device. However, other delays may be compensated accordingly to meet the design criteria of a particular application.

The circuit 118 may have an output 156 that may present the signal DLY_RANGE and an input 158 that may receive the signal CLK_OUT. The signal DLY_RANGE may comprise one or more signals. In one example, the signal DLY_RANGE may be a multi-bit signal where each of the bits may be used as an independent control signal. The signal DLY_RANGE may be presented, in one example, as either a parallel or a serial (multiplexed) signal. Alternatively, the signal DLY_RANGE may comprise a clock signal and one or more control signals. In one example, the circuit 118 may be configured to generate the signal DLY_RANGE in response to the signals UPC, DNC and CLK_OUT. Alternatively, the circuit 118 may be configured to use either the signal REF_CLK or the signal FBK in place of CLK_OUT.

The circuit 120 may have an output that may present a signal to an input of the circuit 122. The circuit 120 may be configured to generate, in one example, a current signal in response to the signals UPF and DNF. The circuit 120 may comprise a number of current sources that may be controlled using the signals UPF and DNF.

The circuit 122 may comprise a number of filter elements. In one example, the circuit 122 may comprise a resistor, a first capacitor, and a second capacitor. A node 159 may be formed by connecting the input and output of the circuit 122 to a first terminal of the resistor and a first terminal of the first capacitor. A second terminal of the resistor may be connected to a first terminal of the second capacitor. A second terminal of the first capacitor and the second capacitor may be connected to a supply ground. The signal VCTRL may be presented at the node 159. The signal VCTRL may be generated in response to the signals UPF and DNF.

Figure 4:
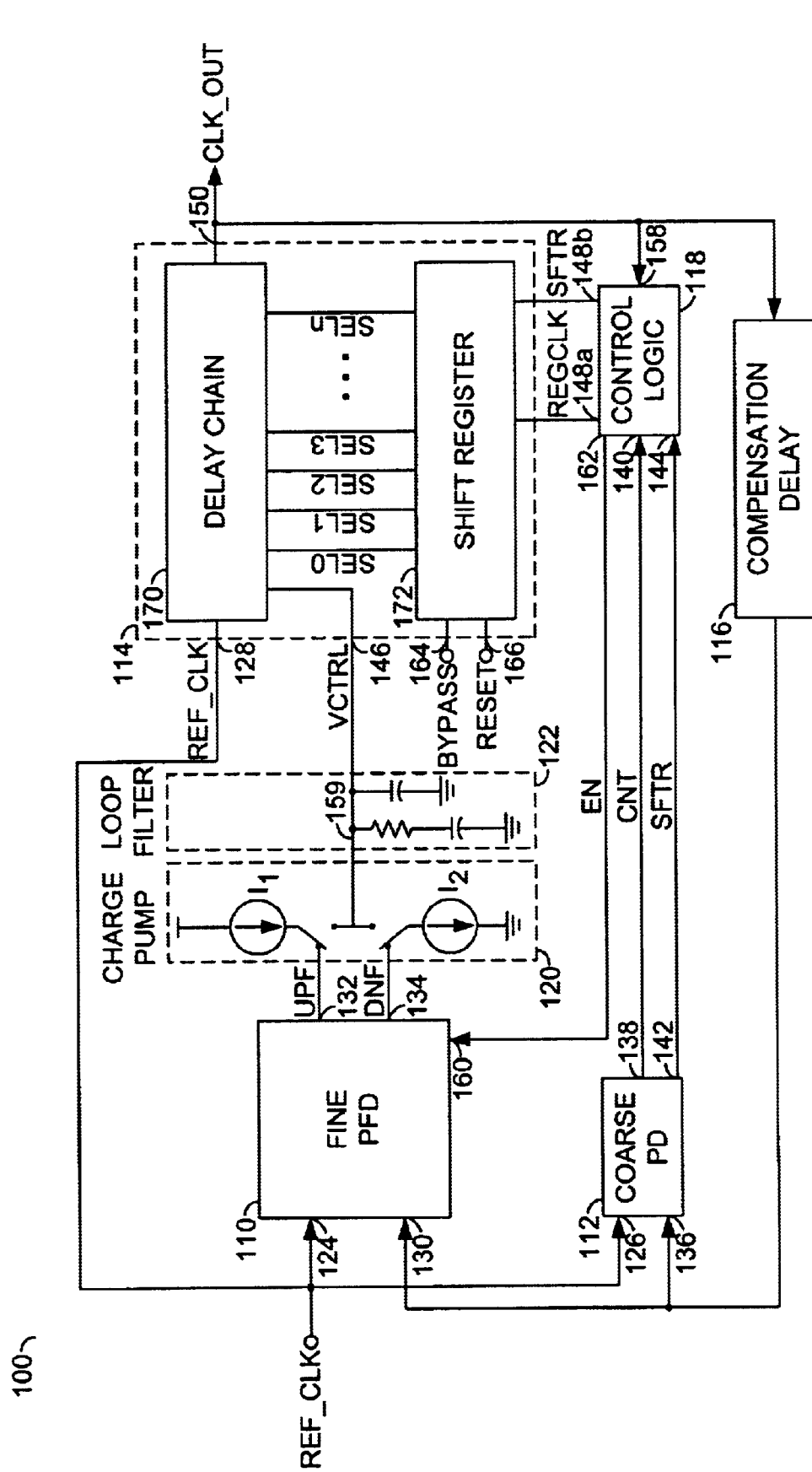
FIG. 4 is a block diagram of a preferred embodiment of the present invention.

Referring to FIG. 4, a more detailed block diagram of the circuit 100 is shown. The circuit 110 may have an enable input 160 that may receive a signal (e.g., EN) from an output 162 of the control circuit 118. A signal (e.g., CNT) and a signal (e.g., SFTR) may be presented at the outputs 138 and 142 of the circuit 112, respectively. The signal CNT may be implemented, in one example, as a count signal. The signal SFTR may be implemented as a shift control signal.

The circuit 114 may have an input 164 that may receive a control signal (e.g., BYPASS) and an input 166 that may receive a control signal (e.g., RESET). The signal BYPASS may be used to bypass the delay line 114. When the signal BYPASS is in an asserted state, the signal REF_CLK may be passed without delay to the output 150. The signal RESET may be a control signal. The delay line 114 may be configured to enter a preconditioned or initialized state in response to the signal RESET. For example, the circuit 114 may be configured to (i) set a number of registers (e.g., 3) to a logical HIGH state, or "one" and (ii) reset any remaining registers to a logical LOW, or "zero", in response to the signal RESET. When the circuit 114 is initialized (reset), a predetermined minimum amount of delay is generally selected (as discussed in more detail in connection with FIG. 11).

The circuit 114 may comprise a circuit 170 and a circuit 172. The circuit 170 may be implemented as a delay chain. The circuit 172 may be implemented as a shift register. The circuit 170 may receive the signal REF_CLK, the signal VCTRL, and one or more control signals (e.g., SEL0–SELn) from the circuit 172. The circuit 172 that may receive the signal BYPASS, the signal RESET, and one or more control signals from the circuit 118. In one example, the circuit 172 may receive a signal (e.g., REGCLK) and the signal SFTR from the circuit 118. The signal REGCLK may be implemented as a clock signal. The circuit 170 may be configured to generate the signal CLK_OUT in response to the signal REF_CLK, the signal VCTRL, and the signals SEL0–SELn. The circuit 172 may be configured to generate the signals SEL0–SELn in response to the signals BYPASS, RESET, REGCLK and SFTR. The circuit 118 may be configured to generate the signals REGCLK and EN in response to the signals CNT, SFSTR, and CLK_OUT.

During a coarse delay adjustment portion of a lock sequence, the control voltage VCTRL may be set at a maximum value, the signal SFTR may be asserted, and the delay line 114 will generally add a predetermined amount of delay (e.g., in response to the signal REGCLK) every cycle until the coarse phase detector 112 deasserts the signal SFTR. The signal SFTR is generally deasserted when the delay overshoots the desired amount. When the signal SFTR is de-asserted, the control circuit 118 will generally control the delay line 114 to remove an amount of delay determined by the signal CNT. The signal REGCLK may be disabled and the signal EN asserted.

After the coarse delay adjustment a fine delay adjustment portion of the lock sequence may be performed. The number of delay elements may remain unchanged and the delay through each element may be varied in response to the signal VCTRL. The delay through each element may be set to a predetermined maximum value during the coarse adjustment. The delay range of each element as a function of the control voltage VCTRL may be predetermined to ensure that the fine adjustments can slow the delay line down into lock.

The coarse and fine adjustment may be implemented by using a chain of delay elements configured to generate a total delay that is greater than a predetermined maximum period of operation when the control voltage VCTRL is at a high range value. The shift register 172 may be used to increment through the delay elements during the coarse adjustment. Each cycle a shift right may occur and the output of the delay chain may be taken from the next delay element. All delay elements that have a logical LOW or "zero" on an enable input may be powered down so that only the minimum number of delay elements necessary are used. Minimizing the number of delay elements may reduce power consumption.

Figure 5:
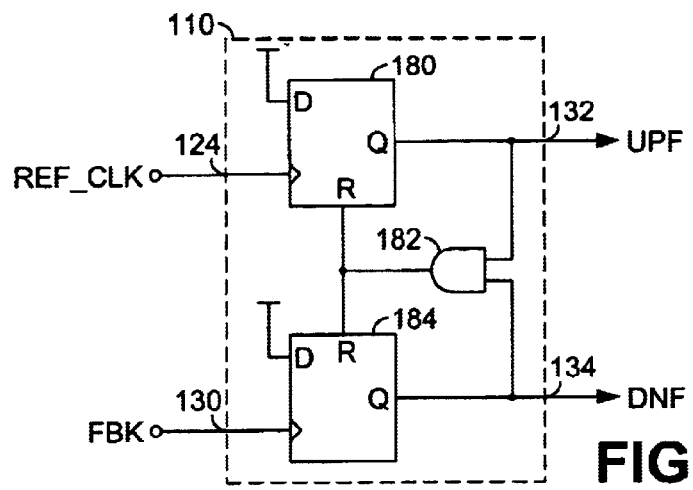
FIG. 5 is a detailed block diagram of a fine phase detector of FIG. 4.

Referring to FIG. 5, a detailed block diagram of the phase detector 110 of FIG. 4 is shown. The phase detectors 110 may comprise a storage element 180, a gate 182 and a storage element 184. The storage element 180 and 184 may be implemented, in one example, as latches, registers, or flip-flops. The gate 182 may be implemented, in one example, as a two-input AND gate. The signal REF_CLK may be presented to a clock input of the register 180. A D-input of the latch 180 may be connected to a supply voltage (e.g., VCC). A Q-output of the latch 180 may present the signal UPF. The signal UPF may be used, in one example, as a pump up signal to control a charge pump circuit. The signal UPF may be presented to a first input of the gate 182. The signal FBK may be presented to a clock input of the latch 184. A D-input of the latch 184 may be connected to the supply voltage VCC. The latch 184 may have a Q-output that may present the signal DNF. The signal DNF may be used, in one example, as a pump down signal to control a charge pump circuit. The signal DNF may be presented to a second input of the gate 182. An output of the gate 182 may present a signal to a reset input of the latch 180 and the latch 184.

Figure 6:
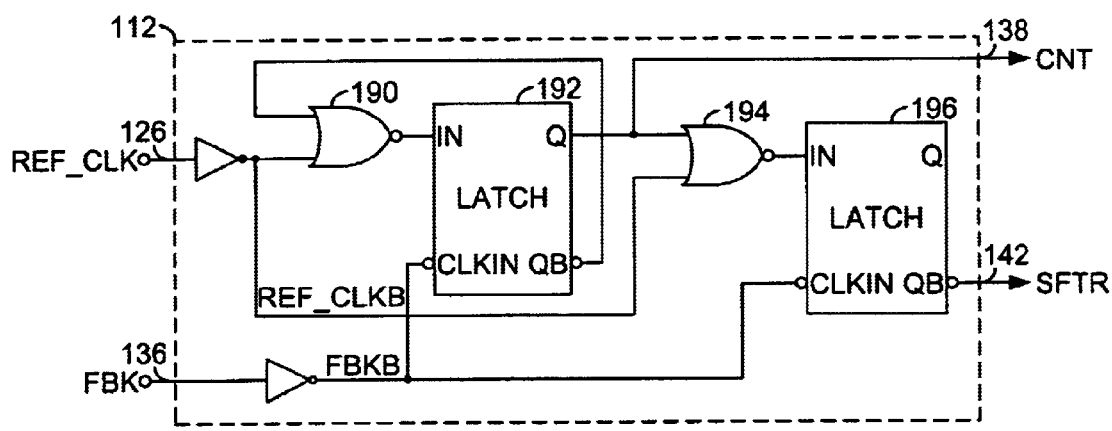
FIG. 6 is a detailed block diagram of a course phase detector of FIG. 4.

Referring to FIG. 6, a more detailed block diagram of the circuit 112 of FIG. 4 is shown. The circuit 112 may comprise a gate 190, a storage element 192, a gate 194, and a storage element 196. The gates 190 and 194 may be implemented, in one example, as two-input NOR gates. However, other gate types may be implemented accordingly to meet the design criteria of a particular application. The storage elements 192 and 196 may be implemented, in one example, as latches. However, other storage elements may be implemented accordingly to meet the design criteria of a particular application. For example, the storage elements 192 and 196 may be implemented as registers or flip-flops.

A complement of the signal REF_CLK (e.g., REF_CLKB) may be presented to a first input of the gates 190 and 194. An output of the gate 190 may be presented to an input of the storage element 192. A complement of the signal FBK (e.g., FBKB) may be presented to a clock input of the storage elements 192 and 196. The storage element 192 may have an output (e.g., QB) that may be connected to a second input of the gate 190 and the output (e.g., Q) that may present the signal CNT to a second input of a gate 194. An output of the gate 194 may present a signal to an input of the storage element 196. The storage element 196 may be configured to present the signal SFTR at a QB-output.

The storage elements 192 and 194 may be configured to start up (initialize) with a predetermined value. For example, the storage element 192 may have an initialized value of 1 and the storage element 196 may have an initialized value of 0. Following startup, the signal SFTR may be presented at a logical HIGH state. The signal CNT will generally remain in a logical HIGH state until the signal FBK has a rising edge (a falling edge of the signal FBKB) that corresponds to a logic LOW state of the signal REF_CLKB. When the signal FBK has a rising edge that corresponds with a logical LOW state of the signal REF_CLKB, the signal CNT will generally transition from the logical HIGH state to a logical LOW state. The signal SFTR will generally remain in a logical HIGH state until the signal FBK latches the signal REF_CLKB with a logic HIGH state. While the signal SFTR remains HIGH, the delay line 114 may be configured to increase the delay of the signal FBK by repeatedly adding a predetermined amount of delay (e.g., one delay cell at a time) until the rising edge of the signal FBK occurs after a rising edge of the signal REF_CLK (a falling edge of the signal REF_CLKB).

Figure 7:
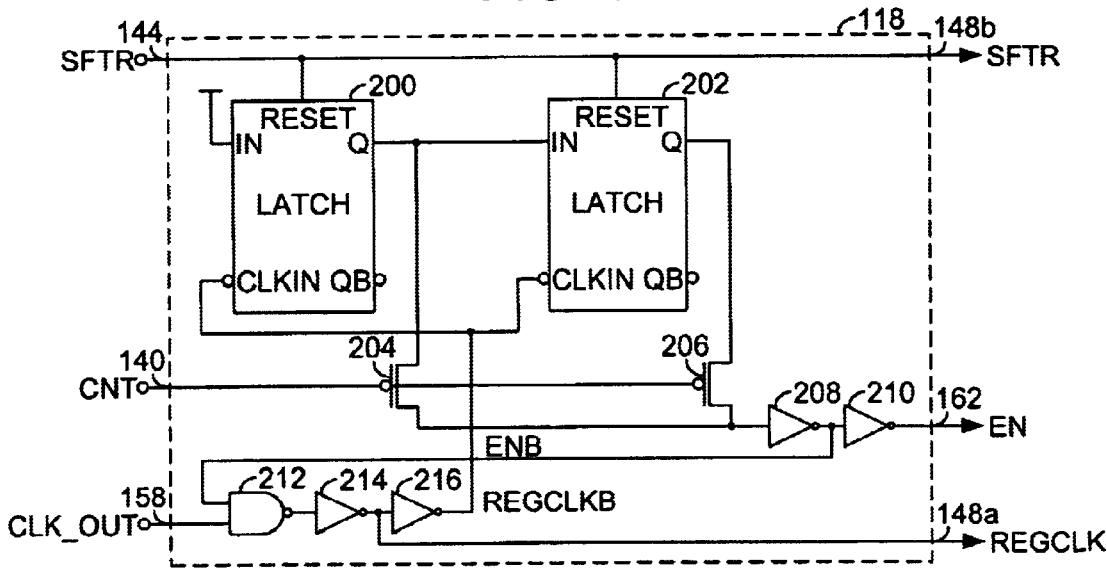
FIG. 7 is a detailed block diagram of a control logic of FIG. 4.

Referring to FIG. 7, a more detailed block diagram of a digital control circuit 118 of FIG. 4 is shown. The circuit 118 may comprise a storage element 200, a storage element 202, a transistor 204, a transistor 206, a gate 208, a gate 210, a gate 212, a gate 214 and a gate 216. The storage elements 200 and 202 may be implemented, for example, using a register, a latch or a flip-flop. The transistor 204 may be implemented, in one example, as one or more PMOS transistors. The transistor 206 may be implemented, in one example, as one or more NMOS transistors. However, other types and polarity transistors may be implemented accordingly to meet the design criteria of a particular application. The gates 208, 210, 214 and 216 may be implemented, in one example, as inverters. The gate 212 may be implemented, in one example, as a two-input NAND gate. However, other types of gates may be implemented accordingly in order to meet the design criteria of a particular application.

The signal SFTR may be presented to a reset input of the latches 200 and 202. An input of the latch 200 may be connected to the supply voltage VCC. An output of the latch 200 may be connected to an input of the latch 202 and a first source/drain of the transistor 204. A Q-output of the latch 202 may be connected to a first source/drain register 206. A clock input of the latches 200 and 202 may receive a signal (e.g., REGCLKb). The signal CNT may be presented to a gate of the transistor 204 and a gate of the transistor 206. A second source/drain of the transistor 204 may be connected to a second source/drain of the transistor 206 and an input of the gate 208. An output of the gate 208 may present a signal (e.g., ENB) to an input of the gate 210 and a first input of the gate 212. An output of the gate 210 may present the signal EN. The signal CLK_OUT may be presented to a second input of the gate 212. An output of the gate 212 may be presented to an input of the gate 214. The signal REGCLK may be presented at the output of the gate 214. The signal REGCLK may be presented to an input of the gate 216. An output of the gate 216 may present the signal REGCLKB.

Figure 8:
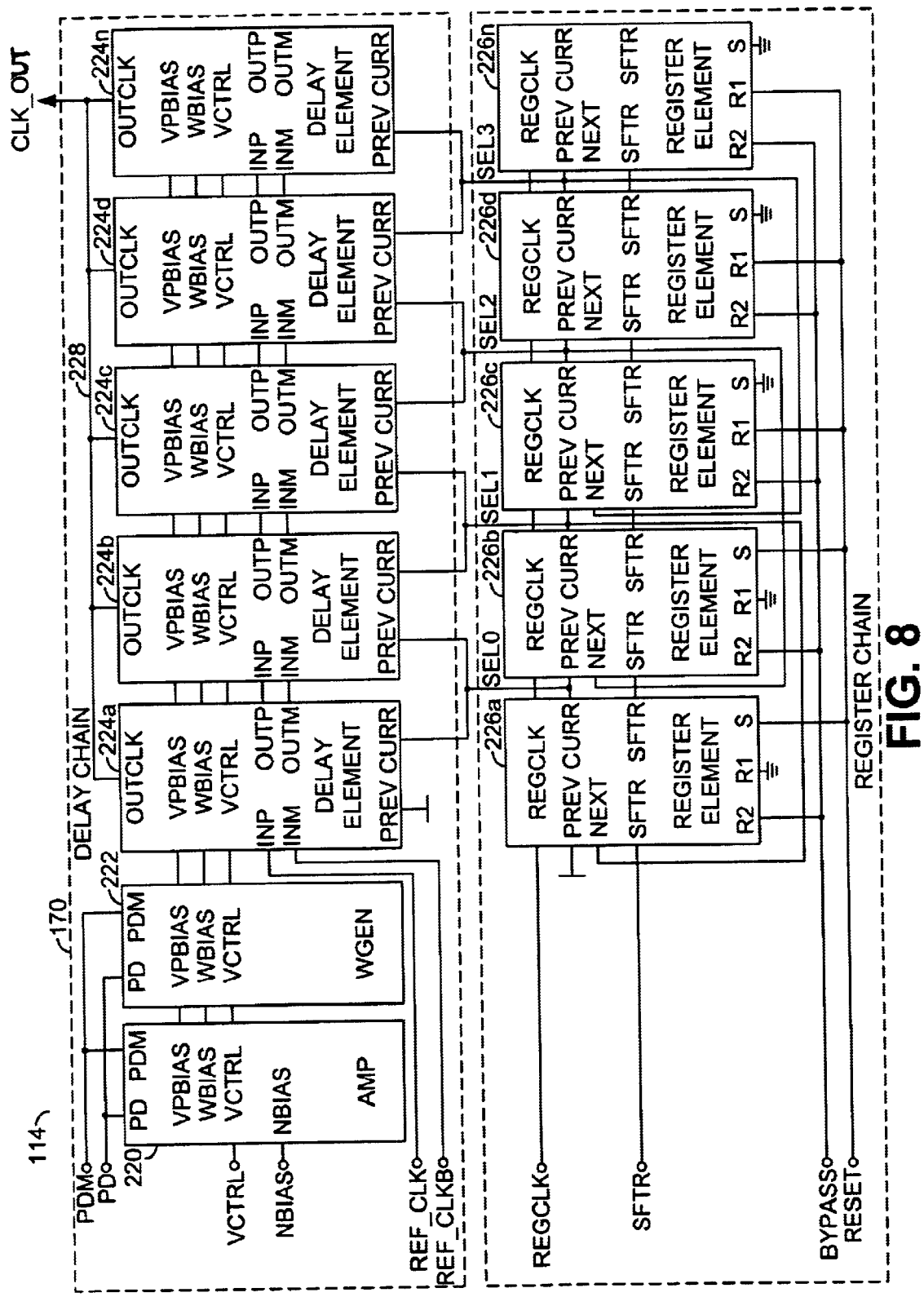
FIG. 8 is a detailed block diagram of an analog delay line of FIG. 4.

Referring to FIG. 8, a more detailed block diagram of the circuit 114 of FIG. 4 is shown. The circuit 170 may comprise an amplifier 220, a bias generator circuit 222, and a number of delay elements 224a–224n. The circuit 172 may comprise a number of register elements 226a–226n. The amplifier 220 may receive the signal VCTRL, a signal (e.g., PD), a signal (e.g., PDM), a signal (e.g., NBIAS), and a signal (e.g., WBIAS). The signal NBIAS may be implemented as a bias signal. The signal NBIAS may be generated by the charge pump circuit 120. In one example, the circuit 120 may comprise a current reference circuit that may be configured to generate the signal NBIAS. The signal WBIAS may be a PFET back bias (or nwell) voltage for the PFETs in the delay chain. The circuit 220 may be configured to generate a bias voltage (e.g., VPBIAS) in response to the signals VCTRL, NBIAS, WBIAS, PD and PDM. The signal PD may be implemented as a powerdown signal. The signal PDM may be a complement of the signal PD. The circuits 220 and 222 may be configured to enter a powerdown or low current mode in response to the signal PD and/or the signal PDM.

The circuit 222 may receive the signals VPBIAS, VCTRL, PD and PDM. The circuit 222 may be implemented as a well-bias generator circuit. circuit 222 may be configured to generate the bias voltage WBIAS in response to the signals VCTRL and PBIAS. The voltage WBIAS may be presented at a substrate connection of each of the PFETs in the delay elements 224a–224n.

The circuits 224a–224n may have a first input that may receive the signal VPBIAS, the second input that may receive the signal WBIAS, a third input that may receive the signal VCTRL, a fourth input that may receive the signal REF_CLK and a fifth input that may receive a complement of the signal REF_CLK (e.g., REF_CLKB). Each of the circuits 224a–224n may have an output that may be connected together to form a node 228. The signal CLK_OUT may be presented at the node 228. The circuit 224a may have a first control input (e.g., PREV) that may be connected to the supply voltage VCC and a second control input (e.g., CURR) that may receive the signal SEL0. A first control input (e.g., PREV) of the circuit 224b may be connected to the second control input (CURR) of the circuit 224a. A second control input (e.g., CURR) of the circuit 224b may receive the signal SEL1 from a corresponding register element (e.g., 226b). The remaining delay elements 224c–224n may be connected similarly.

The signal REGCLK may be presented to a first input of the circuits 226a–226n. The signal SFTR may be presented to a second input of the circuits 226a–226n. The signal BYPASS may be presented to a third input of the circuits 226a–226n. The signal RESET may be presented to a fourth input of the circuits 226a–226n. The circuits 226a–226n may be connected in a serial fashion. For example, an output of a previous circuit (e.g., 226a) may be presented to an input of a current circuit (e.g., 226b) and an output of a next circuit (e.g., 226c) may be presented to an input (e.g., NEXT) of the current circuit (e.g., 226b). The signals SEL0–SELn may be presented at a respective output of the circuits 226a–226n.

Figure 9:
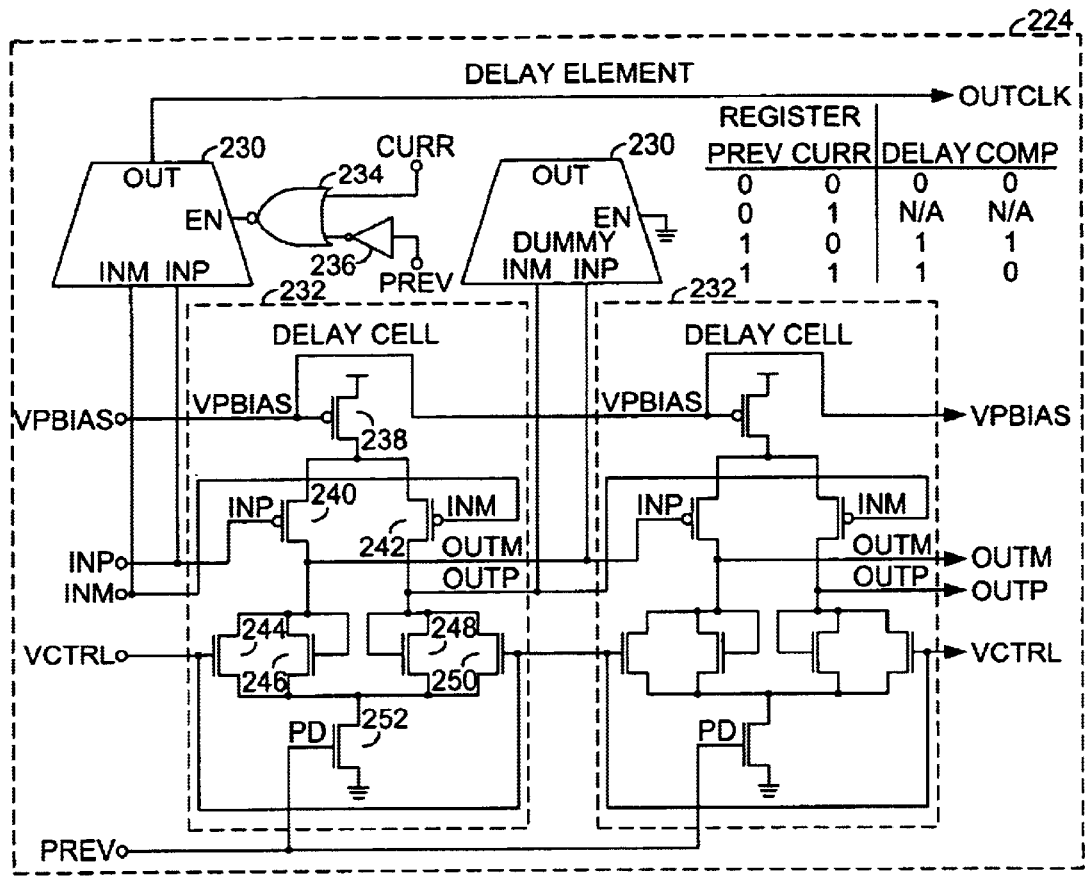
FIG. 9 is a detailed block diagram of a delay element of FIG. 8.

Referring to FIG. 9, a detailed block diagram of a delay element 224 of FIG. 8 is shown. The delay element 224 may comprise a first and a second amplifier 230 and a first and a second delay cell 232. The delay element 224 may include two delay cells 232 so that performance requirements for each individual delay cell 232 may be less stringent (relaxed). However, the delay elements 224 may be implemented with one amplifier 230 and one delay cell 232. The amplifiers 230 may comprise a limited swing differential to full swing amplifier and control logic. In one example, each amplifier 230 may be implemented as a differential CMOS amplifier. The first amplifier 230 may have an output that may present an output signal (e.g., OUTCLK) of the delay element 224.

The circuit 232 may be, in one example, the lowest level delay element of the delay chain 170. The circuit 232 may be implemented as a PFET differential amplifier with a diode load in parallel with a voltage-controlled load. The circuit 232 may comprise a transistor 238, a transistor 240, a transistor 242, a transistor 244, a transistor 246, a transistor 248, and a transistor 250. The transistors 238–242 may be implemented as one or more PMOS transistors. The transistors 244–250 may be implemented as one or more NMOS transistors. However, other types and polarity transistors may be implemented accordingly to meet the design criteria of a particular application.

The transistor 238 may have a source connected to the supply voltage VCC, a gate configured to receive the bias voltage VPBIAS, and a drain connected to a source of the transistor 240 and a source of the transistor 242. A signal (e.g., INP) may be presented to a gate of the transistor 240. A signal (e.g., INM) may be presented to a gate of the transistor 242. The signals INP and INM may be a complementary pair of signals or a differential signal. A drain of the transistor 240 may be connected to a drain of the transistors 244 and a drain and a gate of the transistor 246. A drain of the transistor 242 may be connected to a drain and a gate of the transistor 248 and a drain of the transistors 250. In one example, a source of each of the transistors 244–250 may be coupled to a supply ground (e.g., VSS) via a transistor 252. A signal (e.g., PREV) may be presented to a gate of the transistor 252. The signal PREV may be used to switch the delay cell 232 ON and OFF. The signal PREV may be implemented to disable the delay cells 232 to reduce dc current dissipation.

The second amplifier 230 may be configured to act as a "dummy" amplifier. As used herein, the term "dummy" generally refers to the use of an element to set and/or determine conditions of operation of a circuit rather than provide an actual output for the circuit. The second amplifier 230 may be disabled by connecting an enable input to the supply ground VSS. The first amplifier 230 may be used to match the load and coupling of the first amplifier 230. An enable input of the first amplifier 230 may be connected to a control logic circuit. The control logic circuit may be configured to enable the amplifier when an enable signal from an associated register 226 is a logical LOW or "zero" and a previous delay element has an enable signal that is a logical HIGH or "one". However, other enable states and logic may be implemented to meet the design criteria of a particular application.

Figure 10:
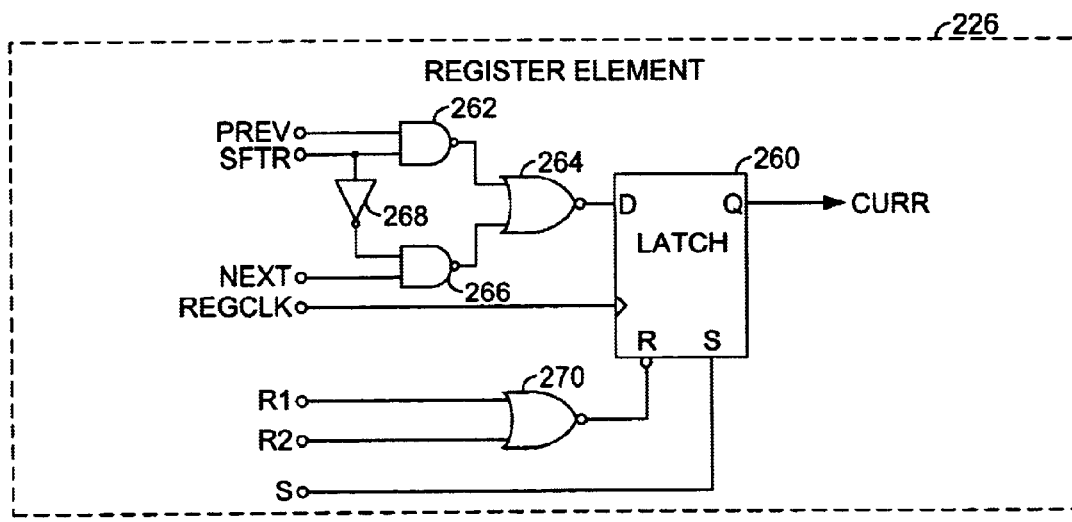
FIG. 10 is a block diagram of a register element of FIG. 8.

Referring to FIG. 10, a more detailed block diagram of a register element 226 of FIG. 8 is shown. Each delay element 224 generally has a corresponding register element 226. Each register element 226 may receive a signal from a previous stage register element (e.g., PREV), a signal from a next stage register element (e.g., NEXT), the signal SFTR, the signal REGCLK, and a number of control signals (e.g., R1, R2 and S). The propagation delay of the signal REGCLK to the output register generally is configured for a minimum propagation delay because the path is generally a critical path to change the delay line before the next clock occurs. The delay chain 170 may comprise an amplifier at the front of the chain that may be configured to receive a single ended clock signal (e.g., REF_CLK) and generate a differential signal (e.g., INP and INM).

The circuit 226 may comprise a storage element 260, a gate 262, a gate 264, a gate 266, a gate 268, and a gate 270. The storage element 260 may be implemented, in one example, as a flip-flop, register or latch circuit. In one example, the storage element 260 may be implemented as a D-type flip-flop with a set input and a reset input. The gates 262–266 may be implemented as two-input NAND gates. The gate 268 may be implemented as an inverter. The gate 270 may be implemented as a two-input NOR gate. However, other types of gates and other numbers of inputs may be implemented accordingly to meet the design criteria of a particular application.

The clock signal REGCLK may be presented to a clock input of the storage element 260. A signal from a previous register element (e.g., PREV) may be presented to a first input of the gate 262. The signal SFTR may be presented to a second input of the gate 262 and an input of the gate 268. An output of the gate 262 may be connected to a first input of the gate 264. An output of the gate 264 may be connected to an input (e.g., the D-input) of the storage element 260. A signal from a next register element (e.g., NEXT) may be presented to a first input of the gate 266. An output of the gate 268 may be connected to a second input of the gate 266. An output of the gate 266 may be connected to a second input of the gate 264. A control signal (e.g., R1) may be present to a first input of the gate 270. A control signal (e.g., R2) may be present to a second input of the gate 270. An output of the gate 270 may be connected to the reset input of the storage element 260. A control signal (e.g., S) may be presented to the set input of the storage element 260. In one example, the signal BYPASS may be used as the signal R1, the signal RESET may be used as the signal S, and the supply ground VSS may be used as the signal R2.

Figure 11:
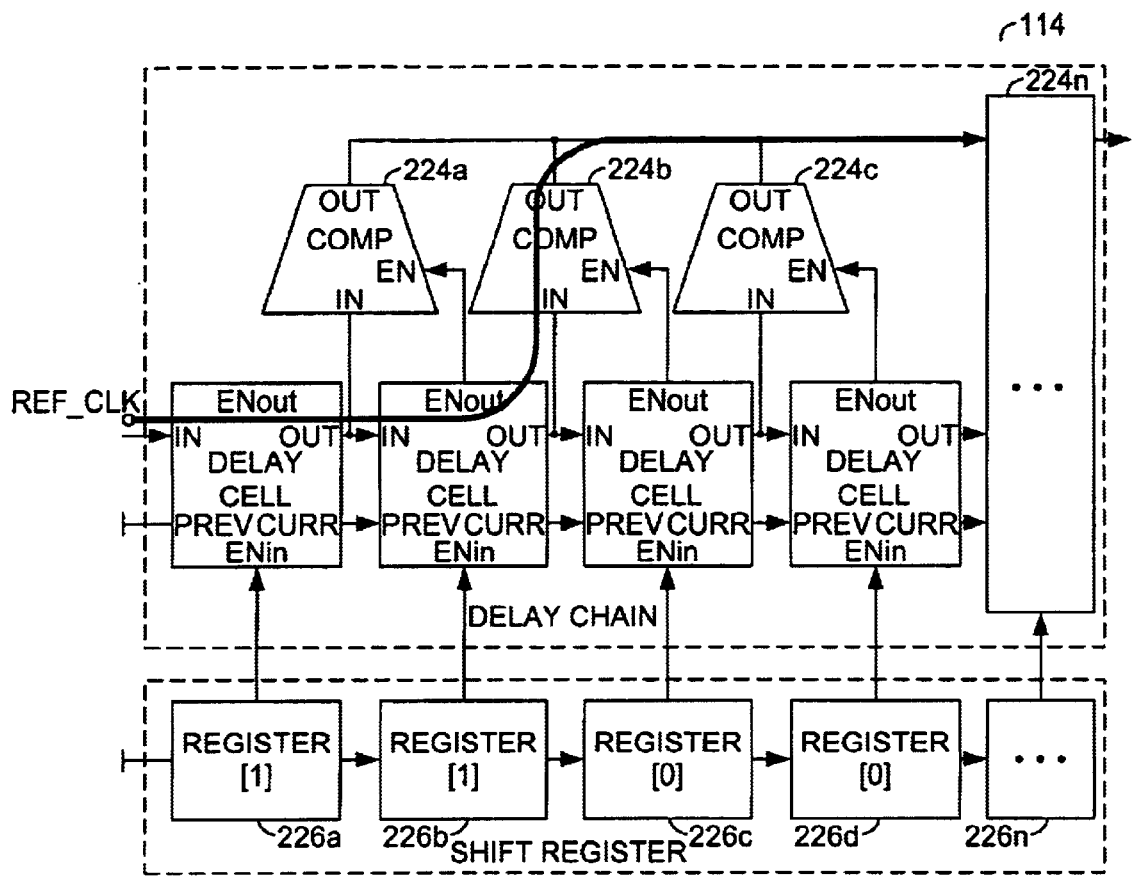
FIG. 11 is a block diagram illustrating an example operation path of the present invention.

Referring to FIG. 11, a block diagram of the circuit 114 is shown illustrating an example operation of the circuit 100 following a reset. During power up and reset the first two register elements 226a and 226b may be set to a logical HIGH, or "one", and the rest (e.g., 226c–226n) may be set to a logical LOW, or "zero". During the reset condition, the signal REF_CLK may flow through the two delay cells 224a and 224b to provide a minimum delay. A reset may occur, for example, (i) after power up, (ii) after the clock has stopped and restarted, or (iii) after the circuit 100 is disabled and re-enabled. The reset may be triggered by an external signal presenting a transition, in one example, from a logical LOW state to a logical HIGH state.

The delay line may be designed to support a predetermined operating range. In one example, a preferred range may be 75 MHz (13.3 ns) to 400 MHz (2.5 ns). However, other ranges may be implemented to meet the design criteria of a particular application. A coarse delay adjustment may be used to support the range of operation and a fine delay adjustment may be used to achieve a fine resolution. A coarse delay may be achieved by adding delay stages and a fine delay may be achieved by changing the control voltage VCTRL for the delay stages.

The delay through each delay cell (stage) when the control voltage VCTRL is at the highest voltage level generally determines how many cells are implemented. The delay line may be set to a smallest propagation delay while the DLL is locking with the coarse phase detector. After overshooting, the delay line may be configured to back up (remove) two or three delay cells depending upon the clock frequency and the compensation delay. Next the control voltage may be lowered until the DLL 100 attains lock.

The number of delay elements that are implemented may be calculated (determined), in one example, using a desired minimum lock frequency (e.g., 83 MHz (12 ns)) and the delay to be compensated (e.g., 2 ns). For example, the delay through each delay element 224 with the control voltage VCTRL at a maximum level may be chosen to be 0.4 ns. Selecting a delay of 0.4 ns for each delay element 224 may result in a delay chain 170 having 25 delay elements 224 ((12−2)/0.4 ns). Since each delay element may have a propagation delay of 0.4 ns, each delay cell 232 generally has a propagation delay of 0.2 ns at a maximum control voltage. Decreasing the control voltage from the maximum to a minimum value during the fine locking operation generally slows the delay element 224 down by the propagation delay of the delay element 224 plus some margin. The margin may account for tracking of the clock after lock and for process changes. The delay range due to the control voltage may be configured to be 2 times the propagation delay. However, other ranges may be implemented accordingly to meet the design criteria of a particular application. To relax the requirement on each delay cell 232, the delay chain 170 may start with three delay elements 224 (6 delay cells 232) enabled. The number of enabled delay elements 224 generally sets the minimum delay in the delay chain 170. For example, each delay cell 232 may have, in one example, a delay range of 200 ps to 333 ps (0.2+2*0.4 ns/6). Each delay cell may be configured to have a gain of 2 * (prop. delay for one delay element with the control voltage at maximum)/[(control voltage range)*(6 delay elements)]. When the propagation delay for a delay element 224 at the maximum control voltage is 0.4 ns and the control voltage range is 0.8V–1.3V, the gain for each delay cell 232 is generally (2*0.4 ns)/(0.5V*6)=(267 ps/V).

Figure 12:
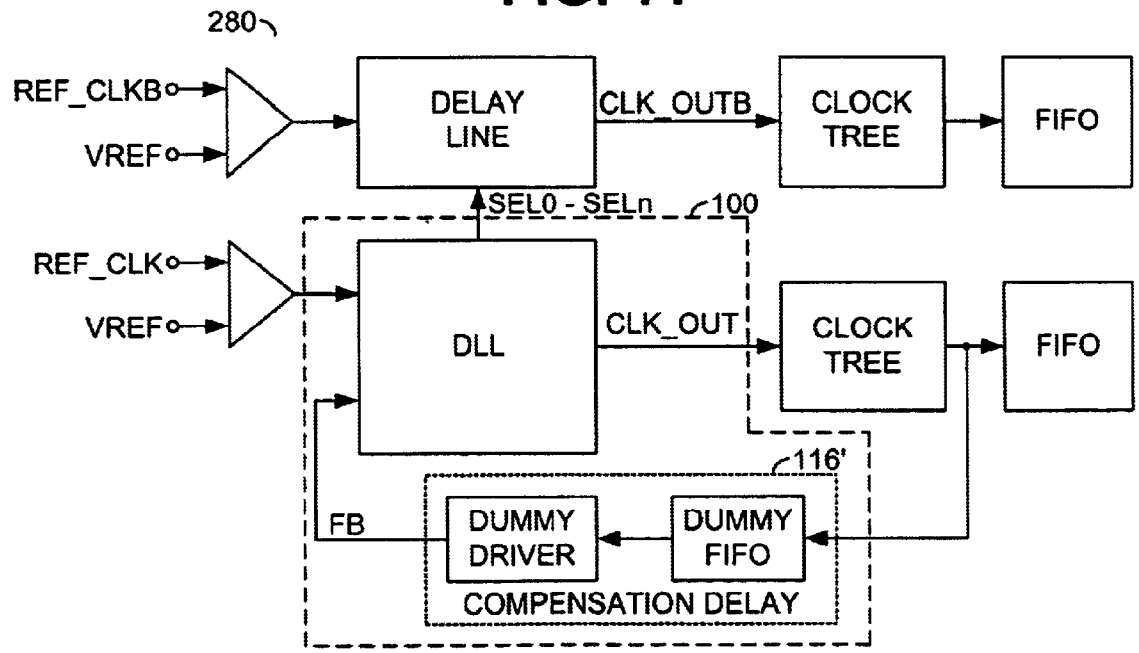
FIG. 12 is a block diagram illustrating an alternative embodiment of the present invention.

Referring to FIG. 12, a block diagram of a circuit 280 is shown. The circuit 280 may be implemented to generate a pair of complementary clock signals. The circuit 100 may use the signal REF_CLK to generate a number of control signals. A complement of the signal REF_CLK (e.g., REF_CLKB) may be passed through a second delay line 114 that may be controlled by the same control lines (e.g., the signals SEL0–SELn) as the circuit 100. The complementary clock signals REF_CLK and REF_CLKB may propagate through the respective delay lines and clock trees to respective FIFOs. An output of the clock tree connected to the circuit 100 may be presented to a "dummy" FIFO and driver block 116'. The circuit 100 may use the actual clock to output delay (tco) except for the FIFO, driver, and package parasitics/loads to adjust the phase of the signals CLK_OUT and CLK_OUTB. The "dummy" driver may be a cut-down version of the real driver but generally also uses VCCQ/VSSQ to match the delay due to the power supplies.

Figure 13:
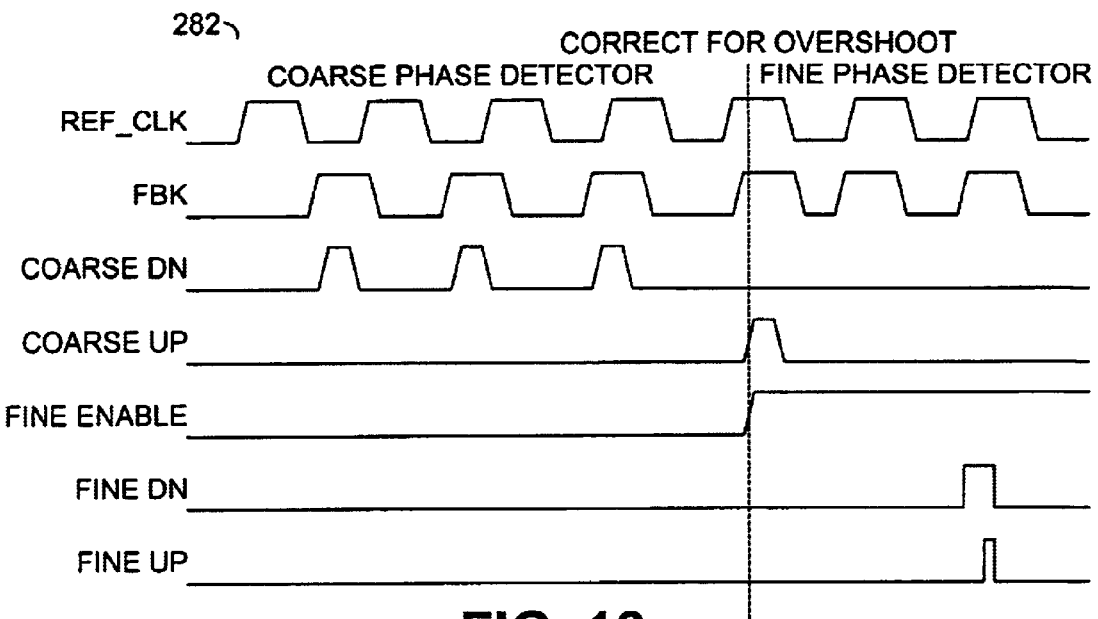
FIG. 13 is a timing diagram illustrating an example operation of the present invention.

Referring to FIG. 13, a timing diagram 282 is shown illustrating an example reset operation of the present invention. The reset generally causes the circuit 100 to start a locking sequence beginning with a coarse phase adjustment portion using the coarse phase detector 112. The fine phase detector 110 is generally disabled during the coarse adjustment portion of the locking sequence. With the voltage control signal VCTRL set to the highest control voltage level, the coarse phase detector generally controls the shift register 172 to shift right every cycle until the delay of the delay line 114 overshoots a desired amount. Every cycle one additional delay element 224 with an amplifier 230 may be enabled in the delay chain 170. The coarse phase detector generally outputs a down signal every cycle only until the phase of the signal FBK overshoots the phase of the signal REF_CLK. When the phase of the signal FBK overshoots the phase of the signal REF_CLK, the coarse phase detector generally outputs an up signal and enables the fine phase detector.

The delay line 114 generally starts at a minimum delay and is increased so that the signal FBK is locked to the next edge of the signal REF_CLK. By starting with a minimum delay and increasing until there is an overshoot, the circuit 100 may avoid reaching the beginning of the delay line 114. The delay line 114 is generally implemented long enough (e.g., sufficient number of delay elements) to support the lowest desired frequency. After the coarse phase detector detects the overshoot, the shift register generally shifts left two or three elements to correct for the overshoot and the fine phase detector may be enabled to control the voltage control node (e.g., the signal VCTRL) to slow down the delay line 114 to acquire lock.

Figure 14:
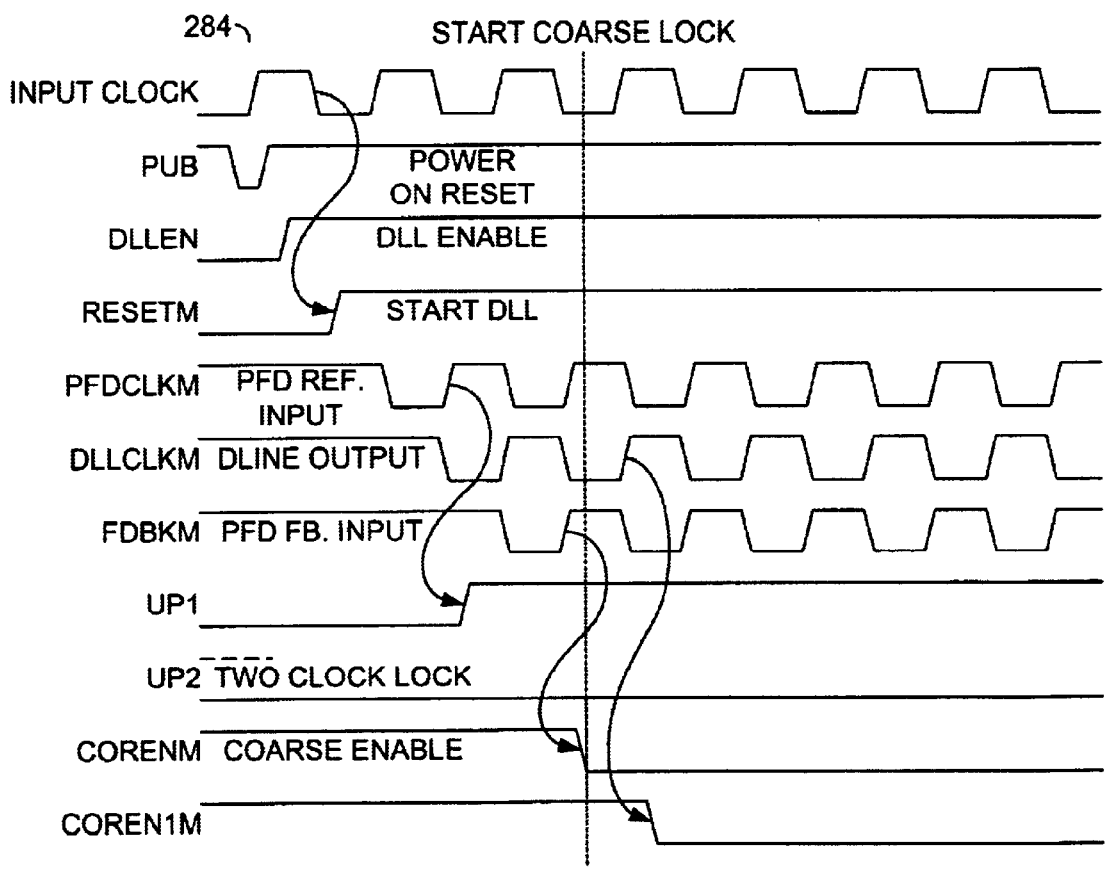
FIG. 14 is a timing diagram illustrating an example reset operation of the present invention.

Referring to FIG. 14, a timing diagram 284 is shown illustrating an example coarse locking operation. The timing diagram 280 generally illustrates various signals of the circuit 100 from a reset condition until the DLL starts shifting right. The circuit may be disabled until after a power-on reset signal (e.g., PUB) pulses. The next falling edge of the input clock generally releases the circuit 100 from the reset condition. The clock to the coarse phase detector 112 (e.g., REF_CLK) generally starts and the signal REF_CLK may begin propagating down the delay line 114. The signal CLK_OUT generally passes through the clock tree (if present) and the compensation delay circuit 116 and becomes the signal FBK. The signals UP1 and UP2 generally indicate whether the propagation delay around the loop was less than one cycle or two cycles, respectively. The signals UP1 and UP2 may be implemented as a single signal (e.g., CNT) that may indicate the number of cycles via a logic state (e.g., a logical LOW representing one cycle and logical HIGH representing two cycles).

The determination of the propagation delay may be used to decide whether to shift left the analog delay line 114 one or two positions after the overshoot. The signal CORENM may be a coarse enable signal and may start the shift right operation. When the propagation delay around the loop (e.g., the delay line and compensation delay) is greater than the clock period, the signal UP1 will generally transition to a high state on the first rising edge of the signal PFDCLKM. When the delay around the loop is greater than two clock cycles, the signal UP2 generally transitions to a high state on the second rising edge of the signal PFDCLKM. When the signal UP1 is in the high state, the delay line 114 generally backs up two positions before switching into the fine delay mode. When the signal UP2 is in a HIGH state, the delay line 114 may be configured to move back three delay positions. When the signals UP1 and UP2 are implemented as the signal CNT, the delay line 114 may be configured, in one example, to back up two positions in response to the signal CNT having a logical LOW state and three positions in response to a logical HIGH state.

Figure 15:
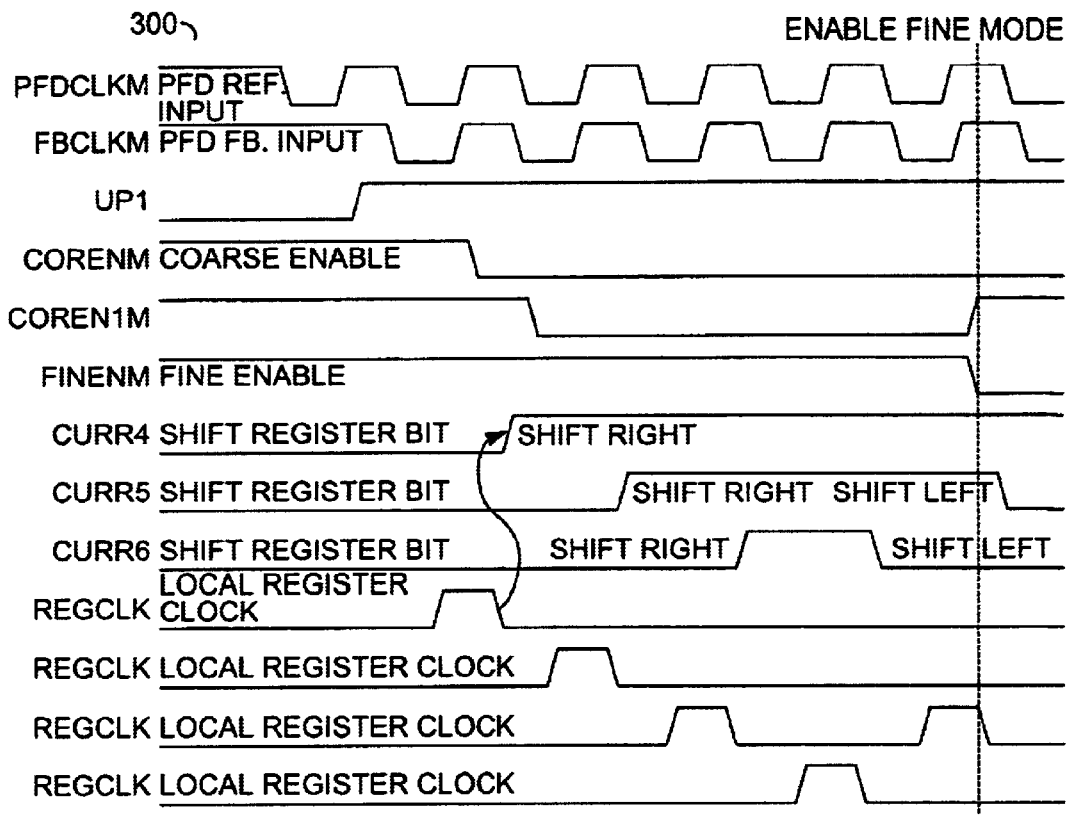
FIG. 15 is a timing diagram illustrating an example coarse adjustment operation of the present invention.

Referring to FIG. 15, a timing diagram 300 is shown illustrating an example coarse locking operation. The coarse locking operation generally begins after a reset and continues until the start of a fine locking operation. During a coarse lock operation on the circuit 100, a falling edge of the signal REGCLK will generally shift the register right. The register may have a carry bit that may transition to a high state after the first shift. A signal (e.g., CURR5) may represent a register bit that may transition to a high state on a next shift right. After the delay line overshoots, the register will generally shift left. The signal REGCLK may cause a signal (e.g., CURR6) to transition to a low state.

Figure 16:
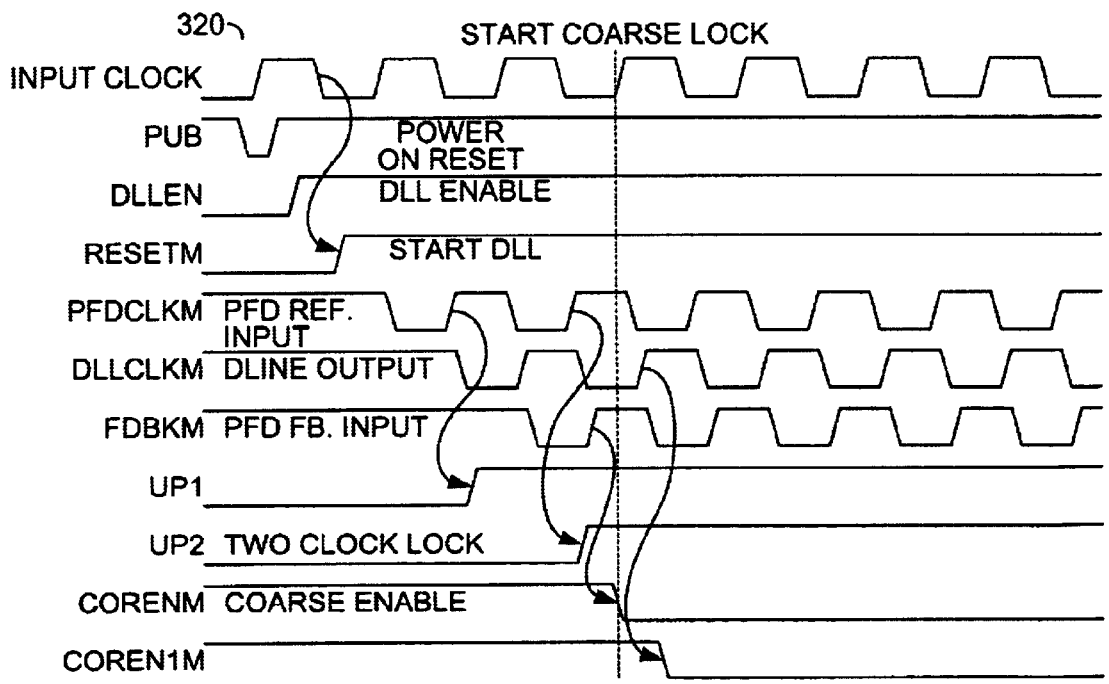
FIG. 16 is a timing diagram illustrating a dual clock adjustment in accordance with the present invention.

Referring to FIG. 16, a timing diagram 320 is shown illustrating an example operation of the present invention. The timing diagram may illustrate an example operation when the clock cycle delay around the loop is greater than two cycles. When the clock cycle delay around the loop is greater than two cycles, the signal UP2 generally transitions to a logical HIGH state.

The present invention may combine the best of an analog DLL and the best of a digital DLL into one. The present invention may provide the resolution or jitter of an analog DLL and the fast lock time of a digital DLL. The present invention may provide a wide locking range.

The conventional method of changing the center frequency of a DLL is to hardwire in (metal optioning) or fuse more stages. The present invention may eliminate the need for fuses or metal options for different speed sorts because of DLL limitations. The present invention may allow lower speed sorts to have the resolution of the higher speed sorts. The present invention may be used in applications that need zero delay buffers including, but not limited to, memory chips that need the clock to output data time to be small.

The circuit 100 may have a disabled mode. When the circuit 100 is disabled, the delay locked loop (DLL) is generally bypassed. When the DLL is bypassed, the DLL may be multiplexed out. The DLL may be in a reset mode as well. When the circuit 100 is re-enabled, the DLL is generally initialized to a redetermined starting point to assure proper operation.

The circuit 100 may have a powerdown mode. In the powerdown mode, the circuit 100 generally does not burn any DC current. The signal REF_CLK may be gated so that the phase detectors 110 and 112, the charge pump 120, and the delay line 114 generally do not consume any DC power. The compensation delay circuit 116 may be gated also since the compensation delay circuit 116 is generally at the end of the clock tree. The powerdown mode may be used to operate the part with zero current.

The circuit 100 may have a standby mode. When the signal REF_CLK is stopped to enter a standby mode, the circuit 100 may require a number of cycles to reacquire lock. In one example, the circuit 100 may take 1024 cycles to reacquire lock after the signal REF_CLK is restarted.

The various signals of the present invention are generally "ON" (e.g., a digital HIGH, or 1) or "OFF" (e.g., a digital LOW, or 0). However, the particular polarities of the ON (e.g., asserted) and OFF (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   an analog delay line (i) comprising (a) a delay chain comprising a plurality of delay elements each comprising a plurality of delay cells and amplifiers and (b) a shift register and (ii) configured to generate an output signal in response to an input signal, a first control signal, and a second control signal, wherein a phase of said output signal is (i) coarsely adjustable with respect to said input signal in response to said first control signal and (ii) finely and continuously adjustable in response to said second control signal; and
   a control circuit configured to generate said first and said second control signals in response to said input signal and said output signal.

2. The apparatus according to claim 1, wherein said shift register comprises a plurality of register elements.

3. The apparatus according to claim 2, wherein each of said register elements comprises a flip-flop.

4. The apparatus according to claim 1, wherein each of said delay elements comprises one or more differential CMOS amplifiers.

5. The apparatus according to claim 1, wherein each of said delay elements comprises one or more differential amplifiers with a diode load in parallel with a voltage-controlled load.

6. The apparatus according to claim 1, wherein said control circuit comprises:
   a phase detector circuit configured to generate said first and second control signals in response to said input signal and a feedback signal; and
   a delay circuit configured to generate said feedback signal in response to said output signal and a predetermined delay.

7. The apparatus according to claim 6, wherein said phase detector circuit comprises:
   a first phase detector circuit configured to generate said first control signal in response to said input signal and said feedback signal, wherein said first control signal is configured to adjust said phase in discrete amounts; and
   a second phase detector circuit configured to generate said second control signal in response to said input signal and said feedback signal, wherein said second control signal is configured to adjust said phase continuously within a predetermined range.

8. The apparatus according to claim 7, wherein said first phase detector circuit comprises a digital control circuit configured to control said analog delay line in response to a phase difference between said input signal and said feedback signal.

9. The apparatus according to claim 7, wherein said second phase detector circuit comprises a charge pump and loop filter configured to control said analog delay line in response to a phase difference between said input signal and said feedback signal.

10. An apparatus comprising:
    means for generating an output signal in response to an input signal, a first control signal, and a second control signal, wherein a phase of said output signal is (i) coarsely adjusted with respect to said input signal by selecting a number of delay elements in response to said first control signal and (ii) finely and continuously adjustable in response to said second control signal;
    means for generating said first and said second control signals in response to said input signal and said output signal; and
    means for controlling a presentation of data by a memory device in response to said output signal.

11. A method for locking and adjusting a phase of an output signal to a phase of an input signal comprising the steps of:
    (A) generating an output signal in response to an input signal, a first control signal, and a second control signal, wherein a phase of said output signal is (i) coarsely adjusted with respect to said input signal by selecting a number of delay elements in response to said first control signal and (ii) finely and continuously adjustable in response to said second control signal;
    (B) generating said first and said second control signals in response to said input signal and said output signal; and
    (C) controlling a presentation of data by a memory device in response to said output signal.

12. The method according to claim 11, wherein said first control signal comprises a digital control signal.

13. The method according to claim 11, wherein said second control signal comprises an analog control signal.

14. The method according to claim 13, wherein the step (A) comprises the sub-step of:

controlling an amount of delay generated by each of said number of delay elements in response to said analog control signal.

15. The apparatus according to claim 1, wherein said plurality of delay elements are each configured to provide a delay that is continuously adjustable in response to said second control signal.

16. The apparatus according to claim 1, wherein said first control signal comprises a digital control signal and said second control signal comprises an analog control signal.

* * * * *